United States Patent
Knoedl, Jr.

(10) Patent No.: US 6,208,177 B1
(45) Date of Patent: Mar. 27, 2001

(54) OUTPUT BUFFER HAVING IMMEDIATE ONSET OF GENTLE STATE TRANSITION

(75) Inventor: George Knoedl, Jr., Milford, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/321,004

(22) Filed: May 27, 1999

(51) Int. Cl.[7] ................ H03B 1/00; H03K 3/00
(52) U.S. Cl. ............ 327/108; 327/112; 327/170; 327/374
(58) Field of Search ................ 327/108, 112, 327/170, 374, 380; 326/83, 86, 87

(56) References Cited

U.S. PATENT DOCUMENTS

| | | | |
|---|---|---|---|
| 5,594,369 | * | 1/1997 | Kondoh et al. .............. 326/83 |
| 5,781,045 | * | 7/1998 | Walia et al. ............... 327/108 |
| 5,959,481 | * | 9/1999 | Donnelly et al. ............ 327/170 |
| 6,008,684 | * | 12/1999 | Ker et al. ................. 327/428 |

* cited by examiner

Primary Examiner—Terry D. Cunningham
Assistant Examiner—Quan Tra
(74) Attorney, Agent, or Firm—Duane, Morris & Heckscher LLP

(57) ABSTRACT

An integrated circuit has an output buffer circuit for driving voltage state transitions of a transmission line. An output transistor has a gate terminal for controlling an output voltage of the output transistor, which is applied at an output terminal to the transmission line. (A voltage state transition comprises changing the output voltage from a first state voltage to a second state voltage.) An impulse current driver injects charge into the gate terminal during an impulse phase at the beginning of the voltage state transition to rapidly bring the output transistor through its dead zone to the threshold of its active region. A slewing current driver provides a comparatively limited current to the gate terminal after the impulse phase to cause the output transistor to complete a substantially smooth voltage state transition.

19 Claims, 9 Drawing Sheets

100

200

210

300

350

410

420

OUTPUT BUFFER HAVING IMMEDIATE ONSET OF GENTLE STATE TRANSITION

BACKGROUND OF THE INVENTION

1. Field of the Invention

The present invention relates to transmission lines having multiple I/O (input/output) devices attached thereto, and, in particular, to methods and apparatuses for reducing transmission line noise caused by state transitions of the I/O devices.

2. Description of the Related Art

Dozens or more electronic components such as chips containing integrated circuits (ICs) are often coupled via I/O (input/output) terminals to the same transmission line or bus, such as a "backplane" bus of a computer system. The chips are typically coupled to the bus by an output buffer (also sometimes referred to as a bus driver, which comprises a bus driver transistor such as an n-mos field-effect transistor). Each point of interconnection, such as at the junction of one of these ICs and the bus or at a board-edge connector within the bus, introduces an impedance "discontinuity" along the length of the bus that can give rise to reflections along segments of the bus between these discontinuities. Because of the propagation delay between discontinuities, and other transmission line characteristics of the bus, when the termination points of these segments are not ideally matched, these bus structures will exhibit eigenstates or modes from which resonances will arise. If the signals applied to these buses contain energy at frequencies commensurate with these eigenstates or modes then the resonances will be excited.

It is desirable for the output buffers to transfer information at high rates; however, sharp state transitions comprise energy at yet higher frequencies which do not contain information germane to the data being transmitted and which can excite the typically high resonant frequencies of the bus, thus giving rise to excessive noise. A state transition occurs when the output buffer causes the bus voltage to change from a first to a second state voltage, where the first state voltage corresponds to one of a high or low state voltage, and the second state voltage corresponds to the other of the high or low state voltage. In other words, if a high state corresponds to 3.3V, and a low state corresponds to approximately 0V (ground), then a state transition occurs when the output buffer changes the bus voltage from 3.3V to 0V, or from 0V to 3.3V.

For example, high-performance CMOS (complementary metal oxide semiconductor) ASIC (application-specific integrated circuits) designs with hundreds or more I/O terminals on a single chip are becoming common. Wide (e.g., 72 bit) high-speed signal buses are often used to interconnect VLSI (very large scale integration) components. Conventional unterminated interconnects for CMOS-level signals usually have poor signal quality with severe overshoot and ringing, accompanied by electromagnetic interference (EMI) and a tendency to trigger latch-up.

ECL (emitter-coupled logic) is a very high speed logic family that, rather than attempting to swing potentials from rail to rail, mitigates the difficulties of charging and discharging capacitive node parasitics by steering current (in each gate) alternately through one or the other of two paths. ECL-based high-performance systems have used terminated transmission line interconnects to avoid noise such as ringing and reflections. Such techniques are discussed in Blood, W. R., "MECL System Design Handbook," Motorola Semiconductor Products. However, ECL implementations have a relatively high power dissipation and typically require additional power supply levels and differential signal paths.

Another solution to this problem of transmission line noise is described in Bill Gunning, Leo Yuan, Trung Nguyen, and Tony Wong, "A CMOS Low-Voltage-Swing Transmission-Line Transceiver," IEEE 92CH3128-6/92/ 0000–0058 (ISSCC 92, Session 3, High-Performance Circuits, Paper WP 3.7). In this approach, sometimes referred to as GTL (Gunning transistor logic), the gate driver places momentary DC feedback around the output driver FET (field-effect transistor) to make the stepwise transition from one output state to another. Power dissipation is reduced if the signal voltage swing is small, but the minimum voltage swing must be large enough to assure acceptable noise margin. The objective of using GTL is to limit the bandwidth of the signal to frequencies below the resonances that invariably crop up in such systems, and hence minimize noise and ringing (generically referred to herein as noise). With the ever-faster circuit speeds (state transition times and propagation delays) of more complex and/or advanced systems that are emerging, however, conventional GTL-type approaches may still exhibit unacceptable noise and ringing.

SUMMARY

An integrated circuit has an output buffer circuit for driving voltage state transitions of a transmission line. An output transistor has a gate terminal for controlling an output voltage of the output transistor, which is applied at an output terminal to the transmission line. (A voltage state transition comprises changing the output voltage from a first state voltage to a second state voltage.) An impulse current driver injects charge into the gate terminal during an impulse phase at the beginning of the voltage state transition to rapidly bring the output transistor through its dead zone to the threshold of its active region. A slewing current driver provides a comparatively limited current to the gate terminal after the impulse phase to cause the output transistor to complete a substantially smooth voltage state transition.

DESCRIPTION OF THE PREFERRED EMBODIMENT

Figure 5:
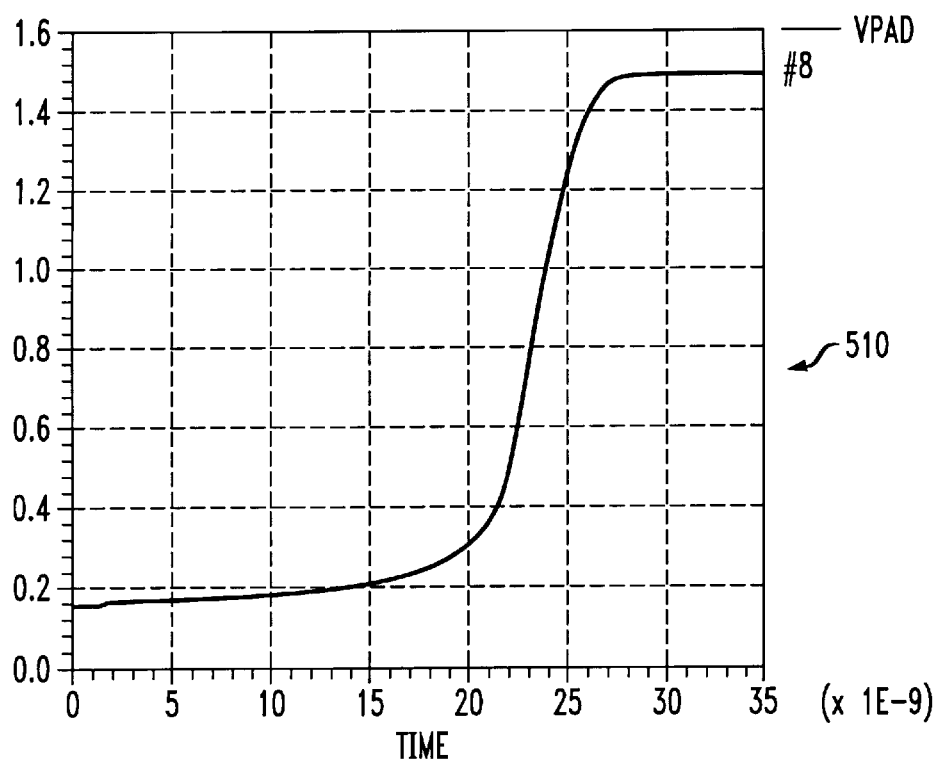
FIG. 5 shows two graphs illustrating the transfer characteristic for the output voltage of an nmos bus driver transistor of the output buffer of FIGS. 2–4 in response to a linear gate voltage applied thereto.
Figure 5:
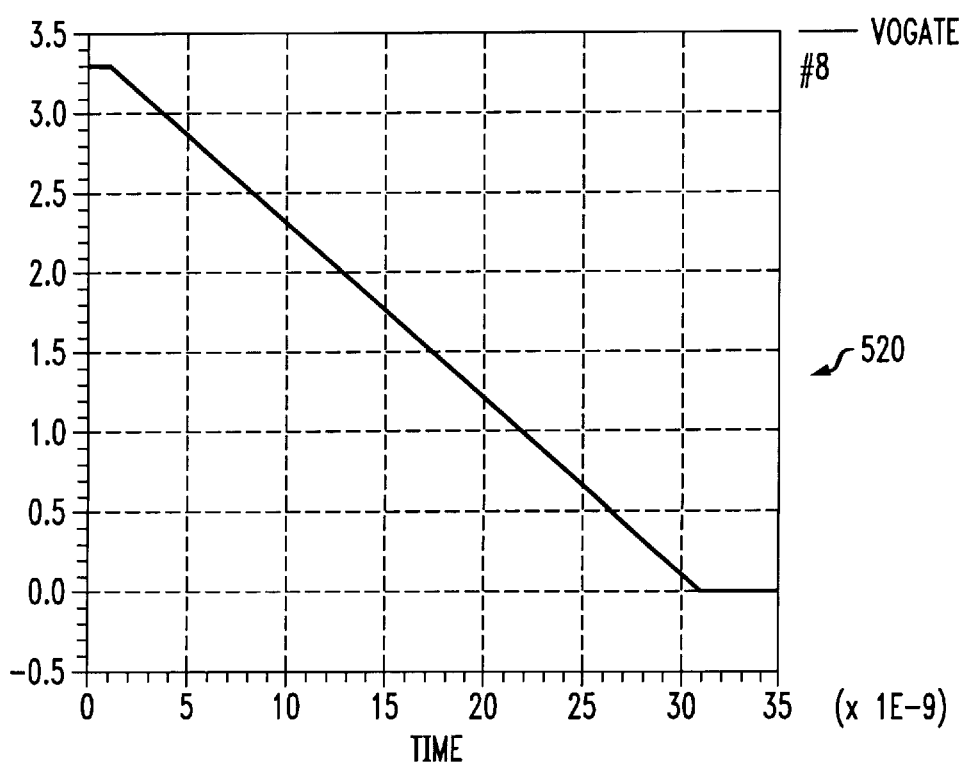

An output buffer that exhibits a gentle linear slewing of its output voltage during state transitions will suffer less signal degradation when applied to the bus. However, as can be seen from waveform 510 in FIG. 5, if a simple, constant rate of charging 520 is applied to the gate of a bus driving output FET, there will be a substantial "dead" interval before any change begins to occur at its output, 510. For a constant gate charging rate slow enough to result in an output transition time of several nanoseconds, for example, this "dead" interval can be several tens of nanoseconds. If the constant rate of charging is increased to reduce this dead time adequately, then the rate of the actual output transition will be proportionately increased such that excessive high frequency energy is generated. This unnecessary high frequency energy can excite resonances in the backplane and, hence, degrade signal quality.

The present invention provides an output buffer which drives a transmission line (bus), where the buffer exhibits substantially smooth, controlled slew transitions to minimize ringing, overshoot, ground-bounce, and related problems. One aspect of the present invention is that there is an immediate onset of a gentle state transition.

The present invention recognizes that the higher frequency components of state transitions of output buffers attached to a common bus can be reduced by slowing down the transition. However, when the state transition is slowed down in the manner of the present invention, it can still be fast enough for system requirements. A system running at a given frequency (e.g., 100 MHz) can support up to twice that rate in bits/s (e.g., 200 Mbits/s), in accordance with the Nyquist theorem. This is because data can change state every half cycle, so that the maximum transmittable data rate is twice the maximum frequency. If left unchecked, digital state transitions typically occur at a rate much higher than the bit transmission rate. For example, a typical state transition may occur at a rate of approximately 100 times the bit transmission rate of the system. However, a state transition of only, say, two or three times the bit transmission rate may still be sufficient for system purposes and can be configured to have fewer high-frequency components if the slew rate is controlled properly, as described in further detail below.

Figure 1:
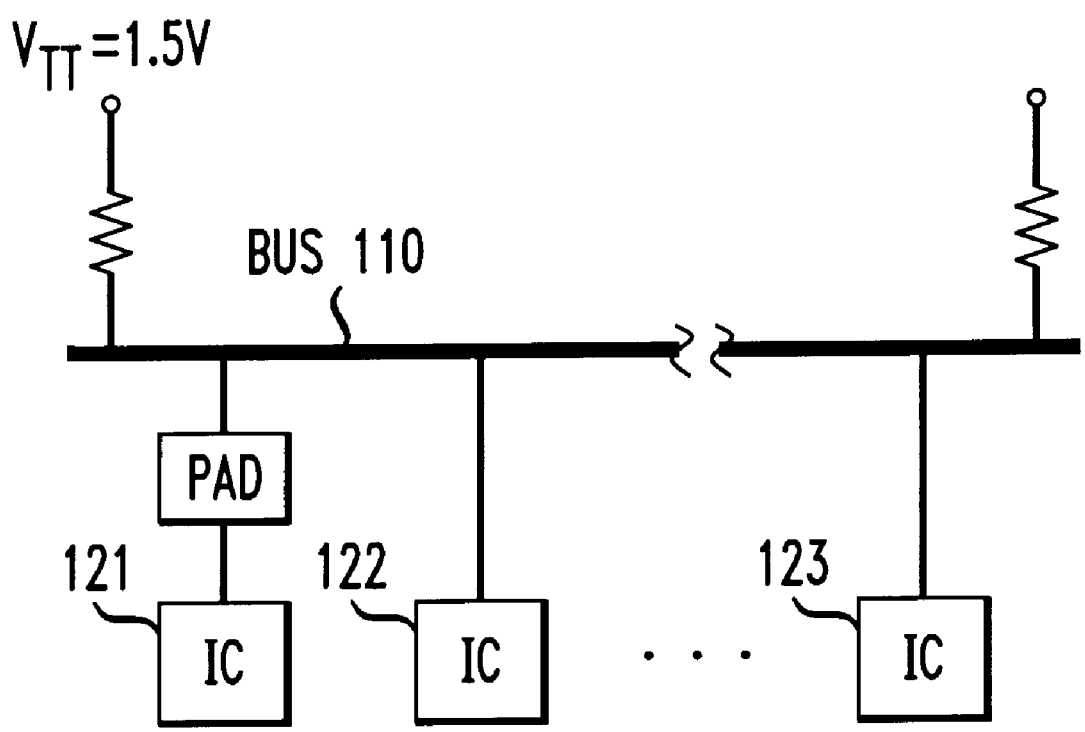
FIG. 1 is a block diagram of a computer system having an external bus to which are coupled a plurality of ICs via a plurality of corresponding connection pads, in accordance with an embodiment of the present invention.

Referring now to FIG. 1, there is shown a computer system 100 having an external bus 110 to which are coupled a plurality of ICs 121, 122, 123 via a plurality of corresponding connection "pads." In an illustrative embodiment of the present invention, the output buffer of each IC contains gate waveform shaping circuitry as illustrated in FIGS. 2–4.

Figure 2A:
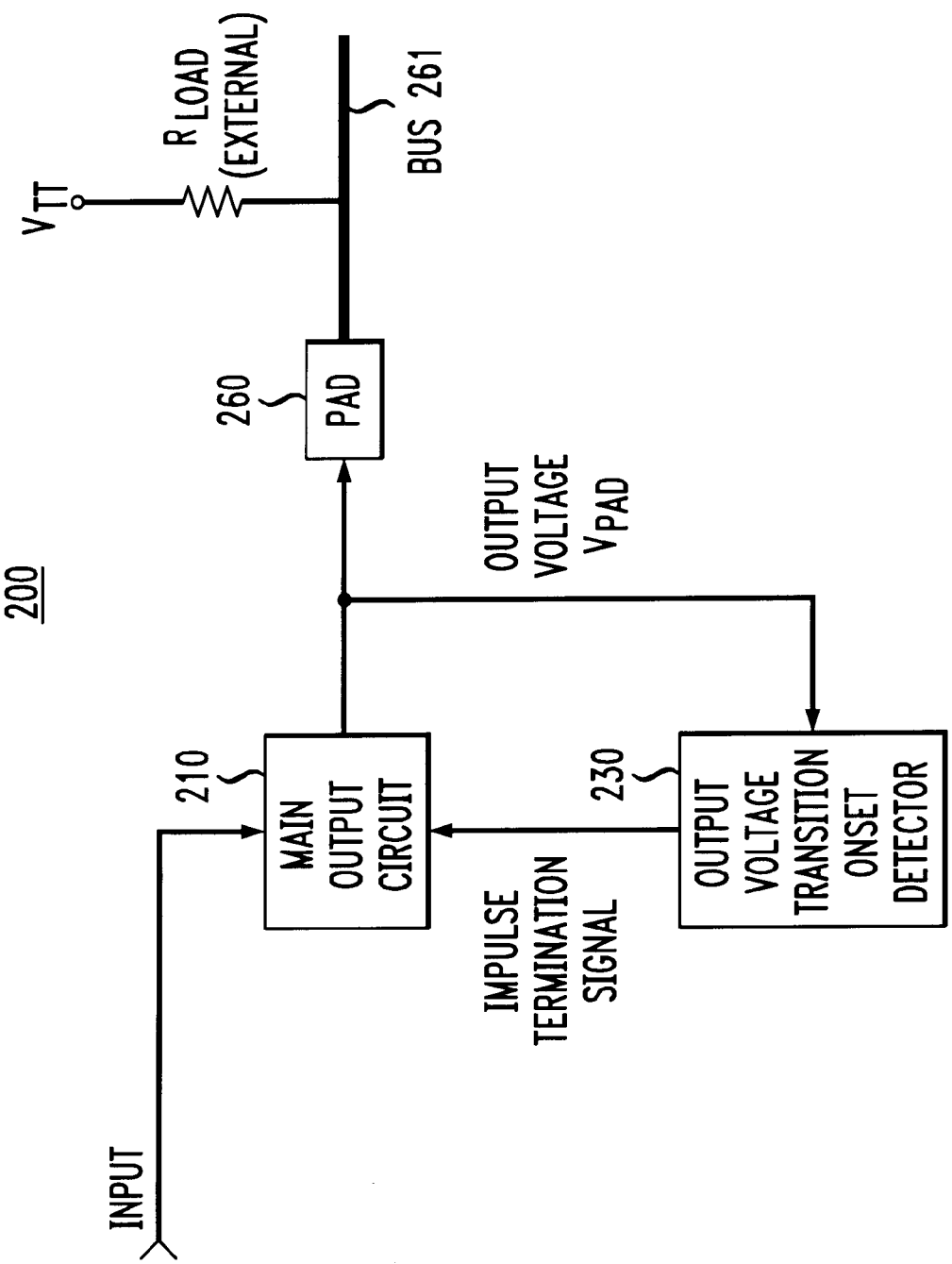
FIG. 2A is a block diagram illustrating the main circuitry of an IC for providing the turn-on and turn-off waveform shaping for the output buffer of the IC, in accordance with an embodiment of the present invention.
Figure 2B:
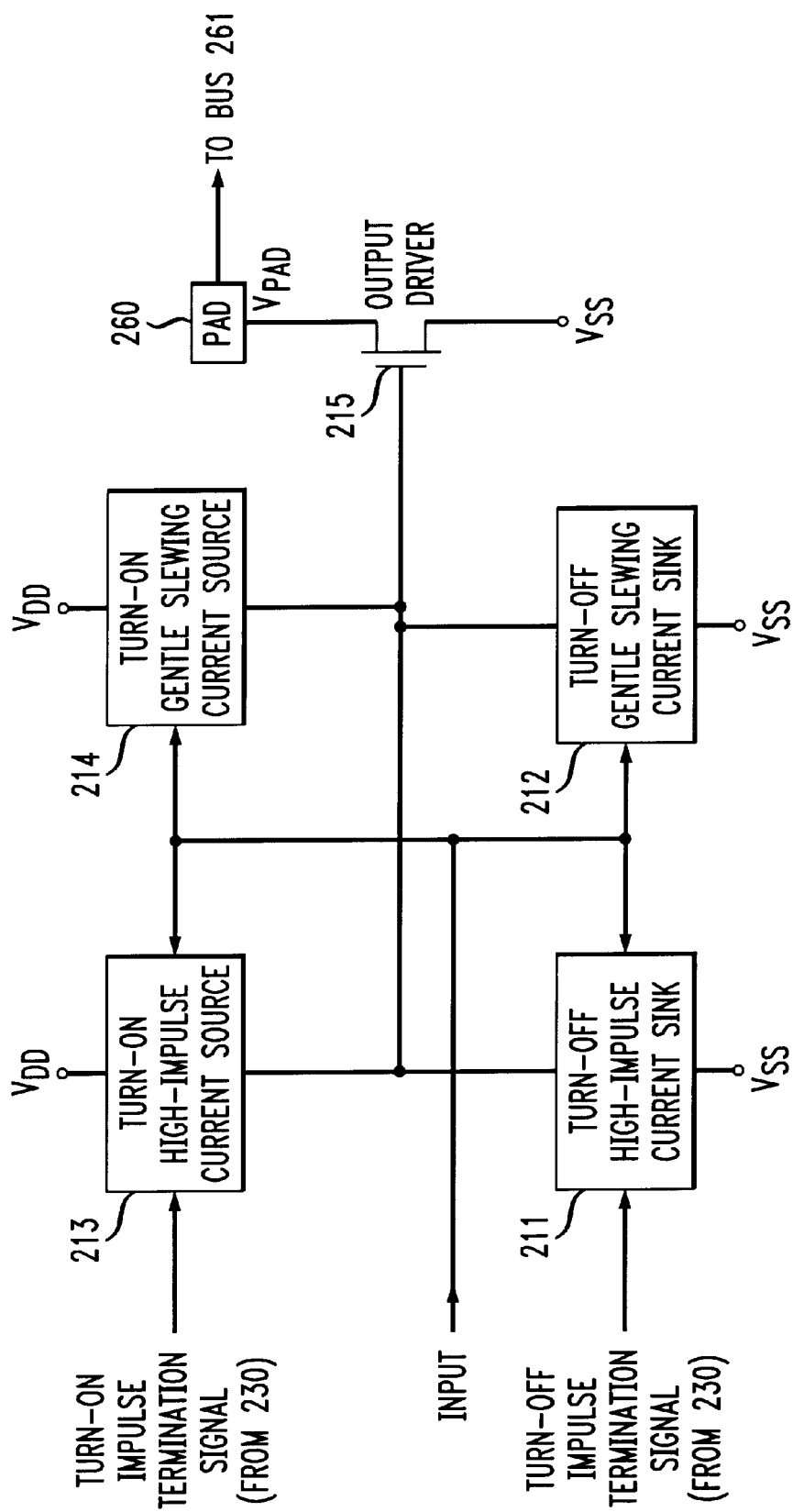
FIG. 2B is a block diagram illustrating the main output circuit block of the circuit of FIG. 2A in further detail.

In accordance with an embodiment of the present invention, each IC of the system of FIG. 1, such as IC 121, is configured as described with respect to IC 200. Referring now to FIGS. 2A and 2B, there is shown, in FIG. 2A, a block diagram indicating the circuitry of an IC 200 for providing the turn-on and turn-off waveform shaping for the output buffer of the IC. FIG. 2B illustrates the main output circuit 210 of IC 200 in further detail. In one embodiment, IC 200 comprises a main output circuit 210, having an output driver 215 which drives an external load $R_{LOAD}$ on bus 261, via a connection to bus 261 through pad 260.

Main output circuit 210 employs waveform shaping circuitry for both the turn-on and turn-off state transition phases of the output buffer. As illustrated in FIG. 2B, main output circuit 210 comprises a turn-off high impulse current sink 211, a turn-off gentle slewing current sink 212, a turn-on high impulse current source 213, and a turn-on gentle slewing current source 214. (In general, the turn-off high impulse current sink 211 and the turn-on high impulse current source 213 may be referred to as impulse current drivers, and the turn-off gentle slewing current sink 212 and the turn-on gentle slewing current source 214 may be referred to as the slewing current drivers.)

The turn-off high impulse current sink 211 is an impulse current driver which injects charge into the gate of the output driver transistor 215 (such as an n-fet (n-channel field effect transistor)) of the output buffer to bring it rapidly through its dead zone to the threshold of its active region, during the on-to-off (output low-to-high) state transition. Similarly, the turn-on high impulse current source 213 is an impulse current driver which injects charge into the gate of the output driver transistor 215 of the output buffer to rapidly bring it through its dead zone to the threshold of its active region, during the off-to-on (output high-to-low) state transition. The expression "inject charge" thus refers to injecting both types of charge carriers, i.e. electrons and holes.

This impulse charging is followed by a slewing period, during which the turn-off slewing current sink 212 and turn-on slewing current source 214, alternately, are used to provide a gentle Miller limited current or charging to yield a substantially smooth transition through the active region of the output driver transistor 215. i.e., the comparatively limited current applied to the gate terminal after the impulse phase by the slewing current driver causes a gentle Miller limited voltage state transition.

The combination of the high impulse current followed by the gentle slewing current for both turn-on and turn-off state transitions causes the respective state transitions to begin very quickly (typically, in 300 picoseconds), while then taking the maximum time available during the data dwell interval (typically, several nanoseconds) to complete the transitions at a relatively smooth, roughly linear rate, thus keeping high frequency energy to a minimum.

If the high impulse current driver is switched off too early, the slewing current may be insufficient to complete the state transition in time; if the high current driver is switched off too late, the state transition may complete too quickly and thus may comprise too many high-frequency components.

In one embodiment, one or more output voltage transition onset detectors 230 are used to monitor the output voltage (or a surrogate thereof, as described below with reference to FIGS. 3A–B) to detect when the onset of a state transition begins, i.e., when the high impulse current driver 211 or 213 is just finishing bringing the output driver transistor 215 through its dead zone to the threshold of its active region. At this point, transition onset detector(s) 230 develop an impulse termination signal which switches off the high impulse current driver(s) of main output circuit 210, to terminate the high impulse charging. This helps to desensitize the circuits to variations in process and operating temperature by metering the correct amount of charge to the gate of the main output device 215 during the turn-on and turn-off impulse phases.

Figure 3A:
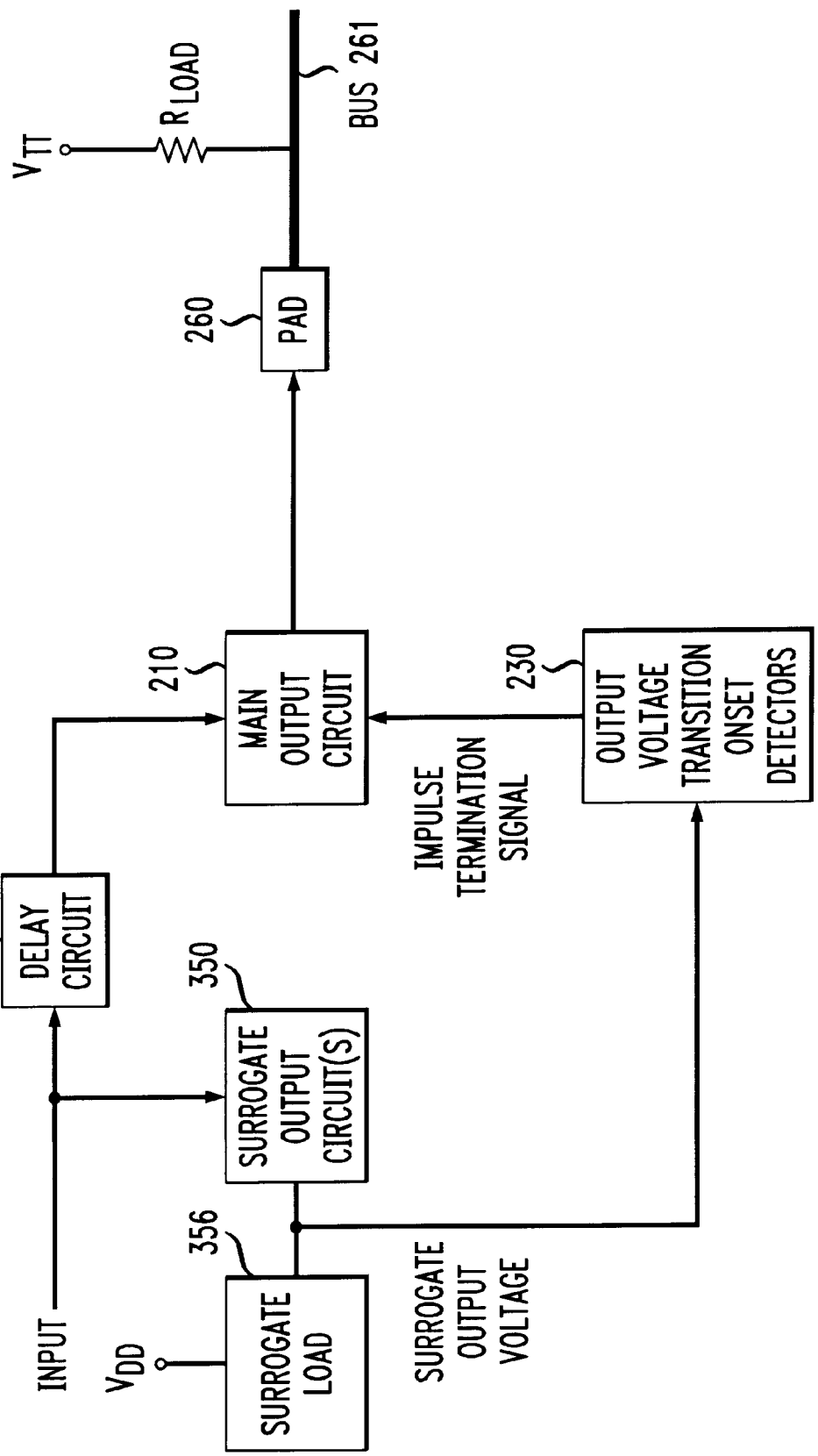
FIG. 3A is a block diagram illustrating the main and surrogate circuitry of an IC for providing turn-on and turn-off waveform shaping for the output buffer of the IC, in accordance with an alternative embodiment of the present invention.
Figure 3B:
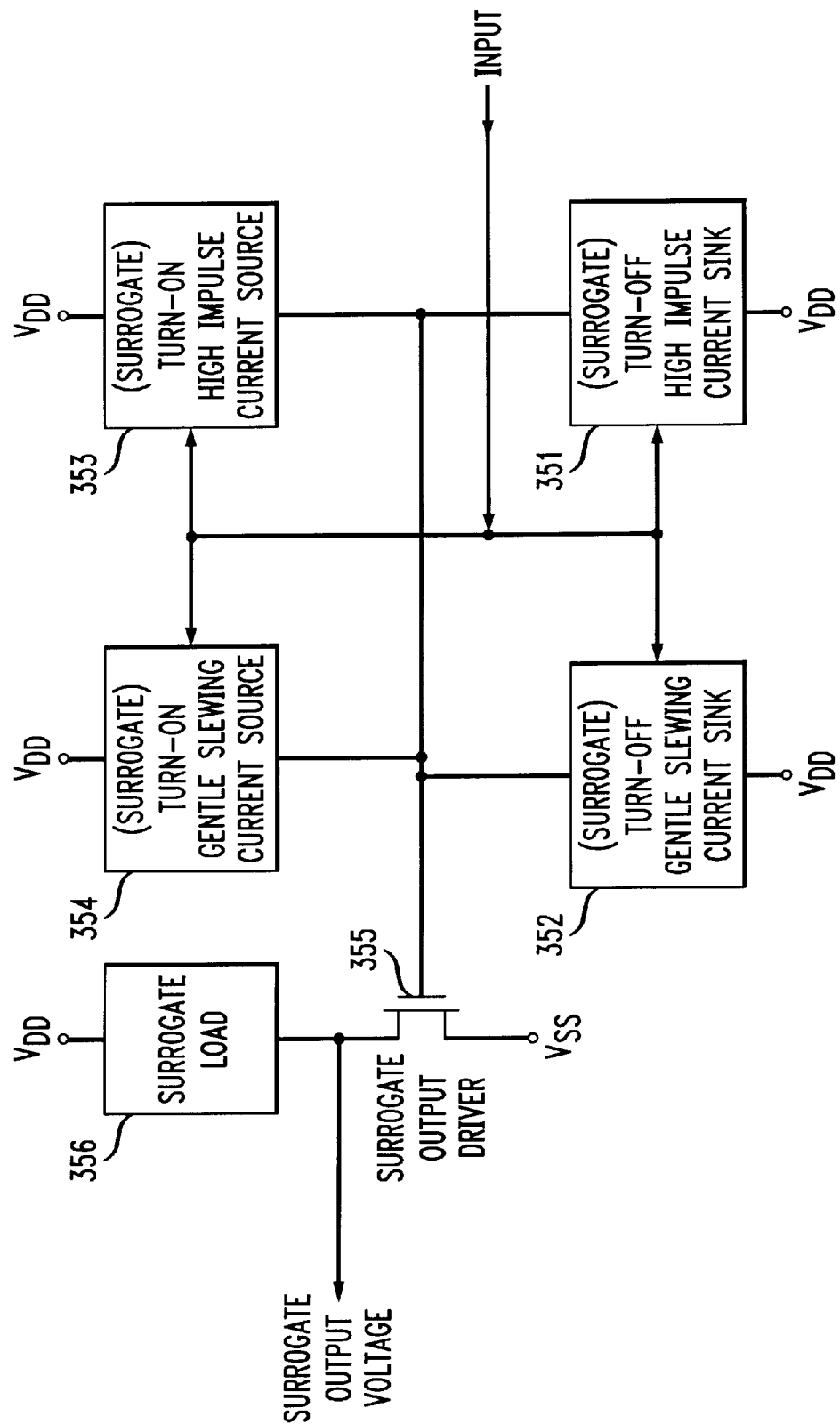
FIG. 3B is a block diagram illustrating the surrogate output circuit block of the IC of FIG. 3A in further detail.

Referring now to FIG. 3A, there is shown a block diagram illustrating the main and surrogate circuitry of an IC 300 for providing turn-on and turn-off waveform shaping for the output buffer of the IC, in accordance with an alternative embodiment of the present invention. IC 300 is configured with a main output circuit 210 and output voltage transition onset detector 230, similarly to IC 200. However, IC 300 also comprises surrogate output circuit 350 and delay 320, and detector 230 is configured to monitor the surrogate output voltage instead of the actual output voltage as in IC 200. Surrogate output circuit(s) 350 is driven by a control input signal and coupled to output voltage transition onset detectors 230. FIG. 3B illustrates the surrogate output circuit 350 of IC 300 of FIG. 3A in further detail.

These surrogate output circuits are scaled replica output circuits designed to mimic the behavior of the actual, main output circuit 210, including main output device 215, and to anticipate its action when this information may not be available early enough to respond appropriately, or may not be available at all. As shown in FIG. 3B, the turn-on and turn-off surrogate output circuits 350 contain surrogate impulse current drivers 351, 353 and surrogate slewing current drivers, 352, 354. The turn-on and turn-off surrogate output circuits 350 each include a surrogate output driver transistor 355, which is coupled to a surrogate load 356. Delay circuit 320, described in further detail below, is optional and may be employed in an embodiment.

In one embodiment, main output circuit 210 receives impulse termination signals from output voltage transition onset detectors 230 sensing surrogate circuitry 350 to switch off the impulse current drivers at the optimal time. Impulse termination signals designed to switch off the high impulse current drivers (for both turn-on and turn-off phases) are therefore provided by the use of one or more surrogate output circuits 350.

Thus, a common input signal is applied to both surrogate and main output circuits 350, 210, to initiate a state transition. (The signal may be delayed by delay unit 320 before applying to main output circuit 310, in an embodiment, as described below.) A surrogate output voltage develops at the surrogate load 356 which mimics the voltage developed at the actual $R_{LOAD}$ by main output circuit 210. However, to account for the time necessary for the impulse termination signal to propagate to the impulse current drivers, the surrogate output voltage can be made to develop some predetermined time before the actual output voltage.

In one embodiment, the surrogate output circuits 350 are scaled to run at a faster rate than the main output circuit 210, and delay circuit 320 is not present. Surrogate output circuits 350 mimic the main output circuit 210, but at a faster rate. Thus, the surrogate output voltage completes the initial onset of state transition (i.e., is brought through its dead zone to the threshold of its active region) some predetermined time before a similar point is reached in the actual output voltage, even though the input signal is applied to both surrogate and main output circuits 350, 210 at the same time and they therefore start at the same time.

In an alternative embodiment, surrogate output circuits 350 mimic the main output circuit 210 at the same rate, and delay circuit 320 delays the input signal to the main output circuit 210 to retard the initiation of the state transition in main output circuit 210, thus allowing the onset of the state transition of the surrogate output circuit 350 to precede that of the main output circuit 210 by an amount equal to that required to transmit metering information (i.e., the impulse termination signal) from the surrogate to the main output circuit. Thus, once again, surrogate output circuits 350 mimic the main output circuit 210, but at the same rate, and starting at an earlier time. Again, the surrogate output voltage completes the initial onset of state transition an appropriate time before a similar point is reached in the actual output voltage.

In either embodiment, this anticipated response is arranged so that the impulse termination signal provided by transition onset detector(s) 230 will arrive at the optimal time. In an alternative embodiment, a combination of a delay provided by delay circuit 320 and a faster operation time of surrogate circuit 350 are used to cause the surrogate output voltage to complete the initial onset of state transition an appropriate time before a similar point is reached in the actual output voltage.

Figure 4A:
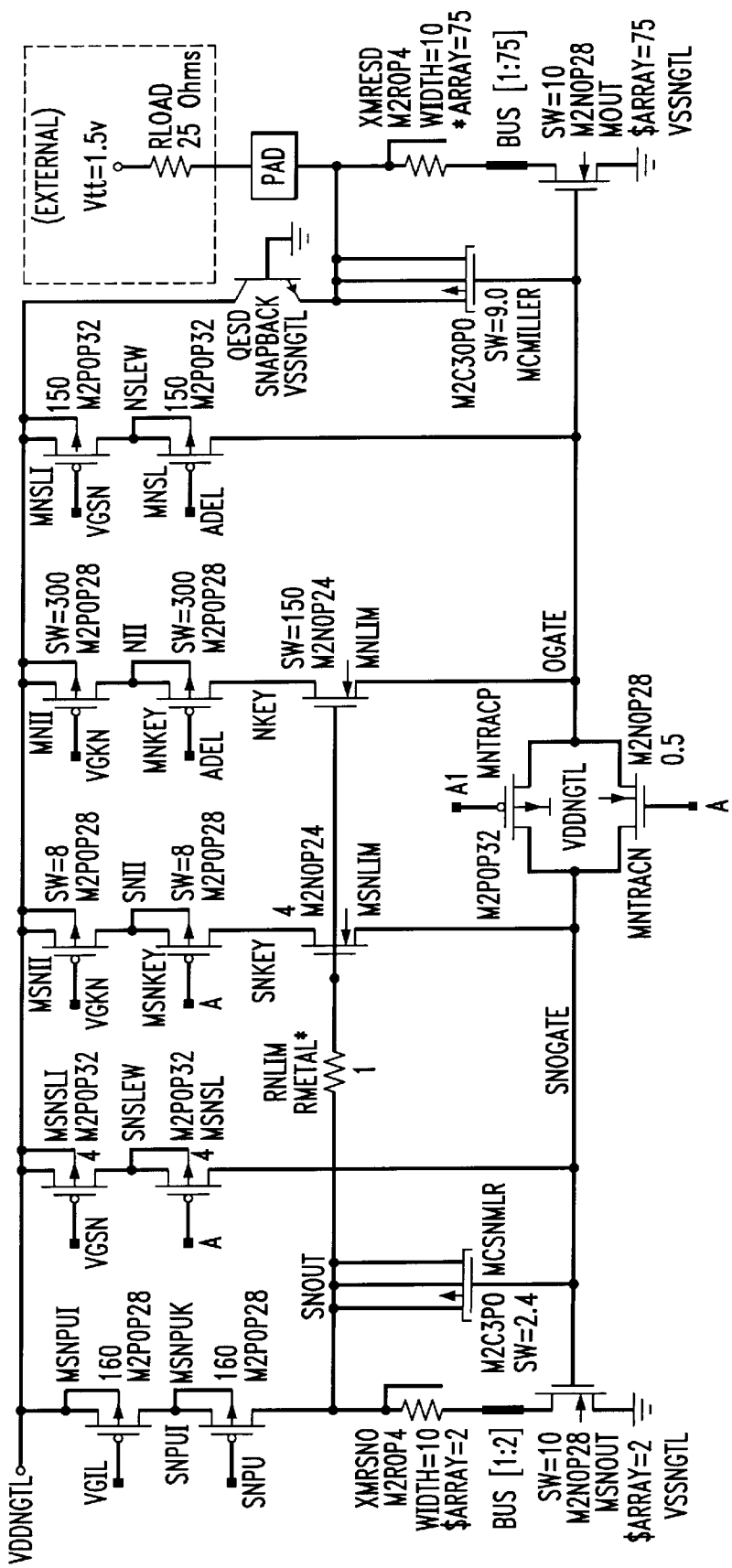
FIG. 4A is a circuit diagram of the turn-on gate waveform shaping circuitry of the output buffer of each IC of the system of FIG. 1.
Figure 4B:
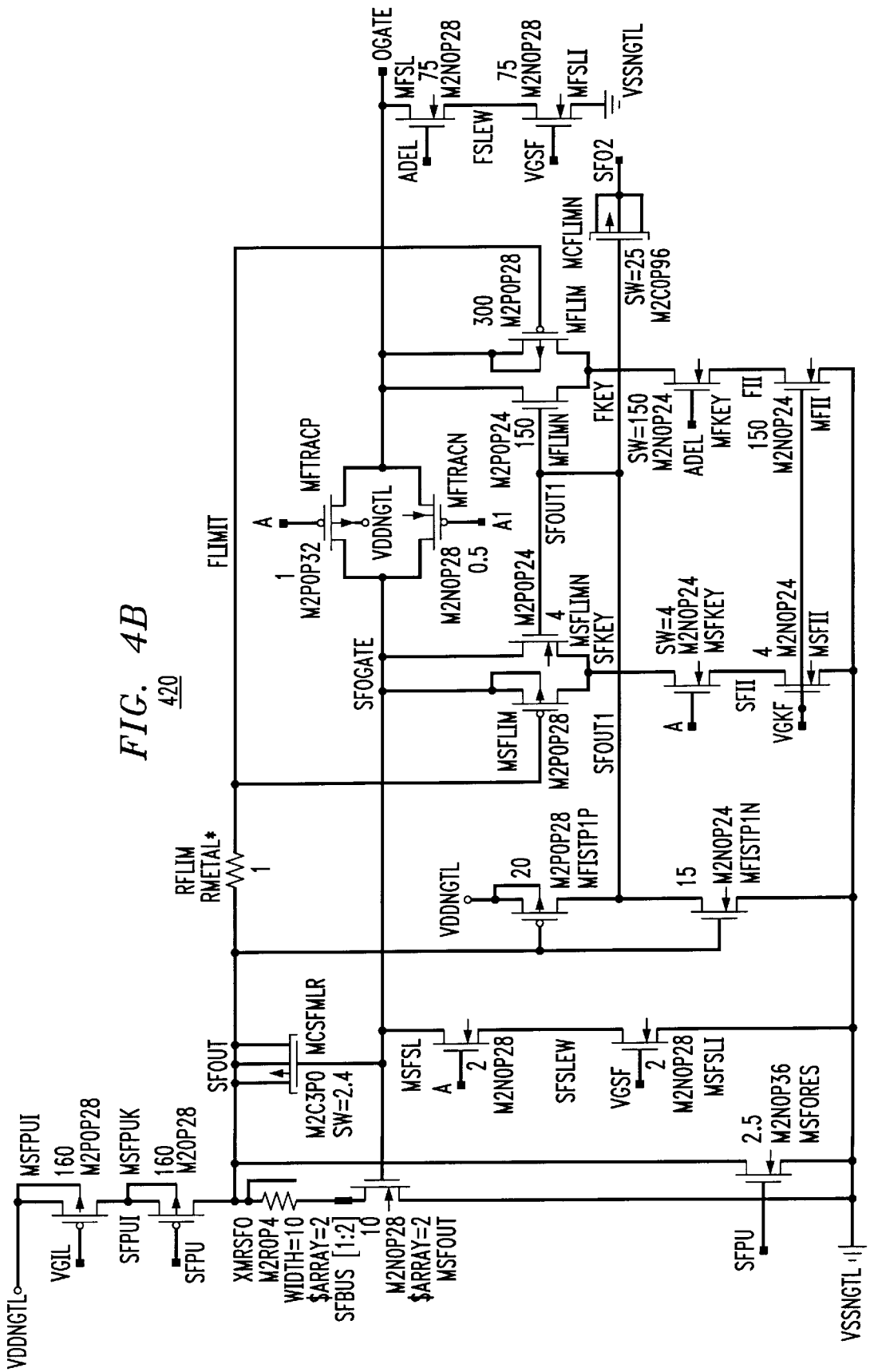
FIG. 4B is a circuit diagram of the turn-off gate waveform shaping circuitry of the output buffer of each IC of the system of FIG. 1.

Referring now to FIG. 4A, there is shown a circuit diagram 410 of the turn-on gate waveform shaping circuitry of the output buffer of main circuit 210 and surrogate circuit 350 of IC 300 of FIG. 3. The n-fet transistor $M_{OUT}$ comprises an open-drain output transistor (215), fed by external load $R_{LOAD}$, and whose gate OGATE is driven by main impulse current source (213), which comprises MNII and MNKEY; main slewing current source (214), which comprises MNSLI and MNSL; main impulse current sink (211), which comprises MFII and MFKEY (FIG. 4B); and main stewing current sink (212), which comprises MFSLI and MFSL (FIG. 4B). Transistor MSNOUT comprises the turn-on surrogate output transistor (355), fed by surrogate load (356), which comprises MSNPUI and MSNPUK, and whose gate SNOGATE is driven by surrogate impulse current source (353), which comprises MSNII and MSNKEY; and surrogate slewing current source (354), which comprises MSNSLI and MSNSL.

Referring now to FIG. 4B, there is shown a circuit diagram of the turn-off gate waveform shaping circuitry 420 of the output buffer of main circuit 210 and surrogate circuit 350 of IC 300 of FIG. 3. Transistor MSFOUT comprises a separate turn-off surrogate output transistor (355), fed by surrogate load (356), which comprises MSFPUI and MSFPUK, and whose gate SFOGATE is driven by surrogate impulse current sink (351), which comprises MSFII and MSFKEY, and by surrogate slewing current sink (352), which comprises MSFSLI and MSFSL.

Transistors MNLIM and MSNLIM and transistors MFLIM, MFLIMN, MSFLIM and MSFLIMN comprise the transition onset detectors 230. A T-gate, comprising MNTRACP and MNTRACN, establishes initial conditions for MSNOUT identical with those of $M_{OUT}$. The T-gate, comprising MFTRACP and MFTRACN, establishes similar initial conditions for MSFOUT. Reference voltages, VGIL, VGKN, VGSN, VGKF and VGSF are generated by current-mirror-like structures (not shown). Signal ADEL is a delayed version of signal A, generated by a delay circuit (320), which comprises a string of simple inverters. Signal A is the input signal.

Figure 6:
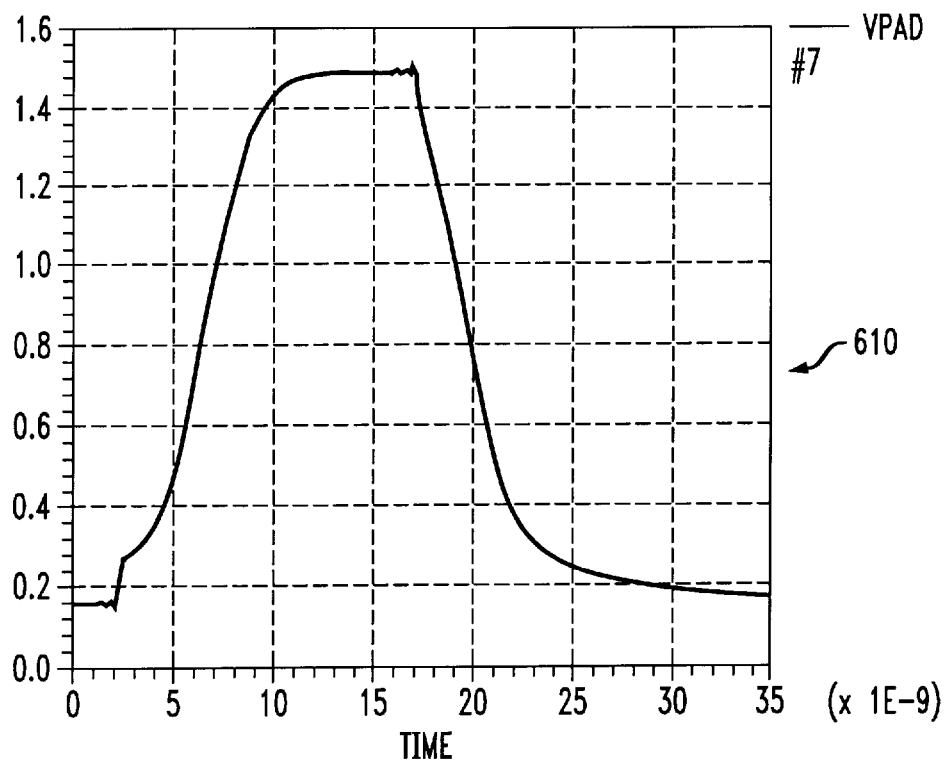
FIG. 6 shows two graphs illustrating, respectively, the improved turn-off and turn-on state transitions for the output voltage of an nmos bus driver transistor of the output buffer of FIGS. 2–4 and the turn-off and turn-on gate voltage driving the improved state transitions, provided by the waveform shaping circuitry of FIGS. 2–4.
Figure 6:
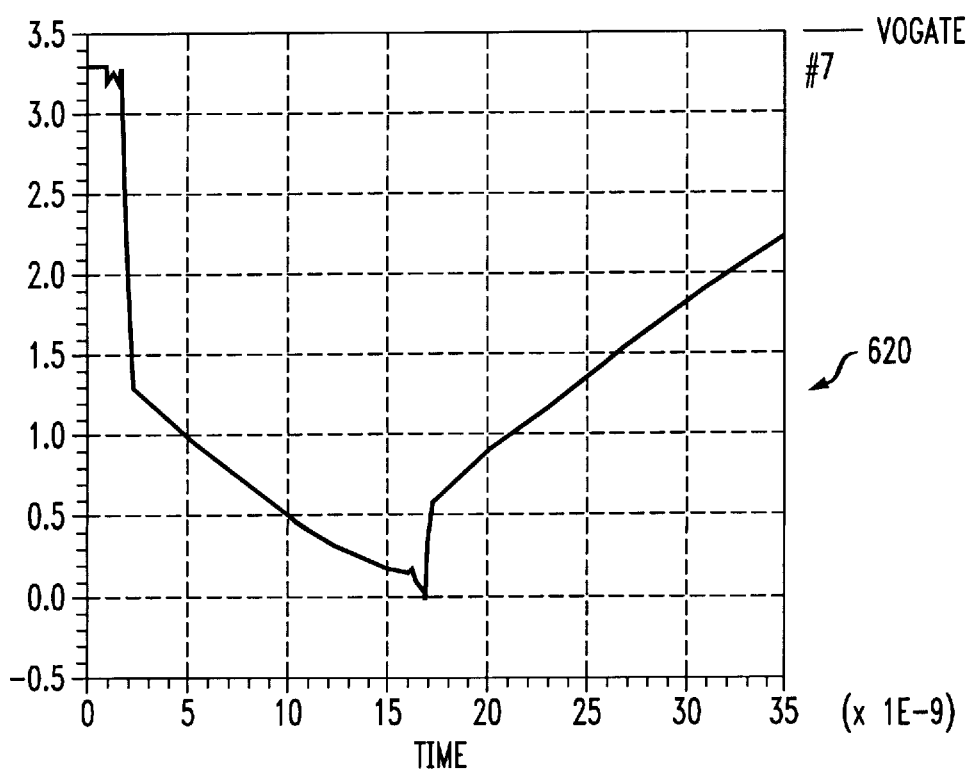

Referring now to FIG. 6, there are illustrated graphs 610 and 620, graph 610 showing the improved turn-on and turn-off state transitions for the output voltage $V_{PAD}$ of nmos bus driver transistor $M_{OUT}$, driven by the turn-on and turn-off gate voltage ($V_{OGATE}$) waveform shaping circuits 210, 410, 420 of the present invention. FIG. 6 shows the output voltage waveform 610 and the gate drive waveform 620 that circuit 410, 420 of FIGS. 4A and 4B produce at nodes PAD (260) and OGATE, respectively.

At time t=2 ns, input signal A is applied to surrogate turn-off impulse driver MSFKEY, and shortly thereafter, signal ADEL is applied (by delay 320) to main turn-off impulse driver MFKEY. This causes gate waveform 620 at OGATE to change abruptly from 3.3V to approximately 1.3V, the upper threshold of the active region of output n-fet, $M_{OUT}$, during which time its output voltage at PAD increases about 0.1V (cutting off about 20 ns worth of dead time from waveform 510 in FIG. 5), and after which slewing current driver comprising MFSL and MFSLI causes OGATE to continue to slew gently downward while output node, PAD makes a gentle transition toward the 1.5V bus supply rail, $V_{TT}$, over the next 10 ns or so.

In a similar fashion, at time t=17 ns, input signal A is applied to surrogate turn-on impulse driver MSNKEY, and shortly thereafter, signal ADEL is applied (by delay 320) to main turn-on impulse driver MNKEY. This causes gate waveform 620 at OGATE to change abruptly from 0V to approximately 0.6V, the lower threshold of the active region of output n-fet transistor $M_{OUT}$, during which time its output voltage at PAD decreases about 0.1V, and after which slewing current driver comprising MNSL and MNSLI causes OGATE to continue to slew gently upward while output node PAD makes a gentle transition toward ground over the next 10 ns or so.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having an output buffer circuit for driving voltage state transitions of a transmission line, the output buffer circuit comprising:
   (a) an output transistor having a gate terminal for controlling an output voltage of the output transistor which is applied at an output terminal to the transmission line, wherein a voltage state transition comprises changing the output voltage from a first state voltage to a second state voltage;
   (b) an impulse current driver for providing an impulse current for injecting charge into the gate terminal during an impulse phase at the beginning of the voltage state transition to rapidly bring the output transistor through its dead zone to the threshold of its active region; and
   (c) a slewing current driver for providing a gentle Miller limited slewing current to the gate terminal after the impulse phase, wherein the slewing current causes a gentle Miller limited voltage state transition and is comparatively limited with respect to the impulse current so as to cause the output transistor to complete a substantially smooth voltage state transition.

2. The integrated circuit of claim 1, wherein the transmission line is a bus external to the integrated circuit.

3. The integrated circuit of claim 1, wherein voltage state transitions driven by the output buffer circuit occur at a voltage state transition rate approximately comparable to a dwell interval of the data being transmitted by the integrated circuit.

4. The integrated circuit of claim 1, wherein a voltage state transition comprises one of a high-to-low and a low-to-high voltage state transition.

5. The integrated circuit of claim 4, wherein:
   the impulse current driver comprises a turn-on high-impulse current source for injecting charge into the gate terminal during the impulse phase at the beginning of a high-to-low voltage state transition and a turn-off high-impulse current sink for injecting charge into the gate terminal during the impulse phase at the beginning of a low-to-high voltage state transition; and
   the slewing current driver comprises a turn-on gentle slewing current source for providing the slewing current to the gate terminal after the impulse phase of a high-to-low voltage state transition and a turn-off gentle slewing current sink for providing the comparatively limited current to the gate terminal after the impulse phase of a low-to-high voltage state transition.

6. The integrated circuit of claim 1, wherein the slewing current driver provides the slewing current to the gate terminal from the beginning of the voltage state transition until the end of the voltage state transition.

7. The integrated circuit of claim 1, wherein the output transistor is an open-drain nmos output transistor.

8. The integrated circuit of claim 1, wherein an external load is coupled to the transmission line.

9. The integrated circuit of claim 1, further comprising an output voltage transition onset detector for providing an impulse termination signal to cause the impulse phase to end so that the impulse current driver stops injecting charge into the gate terminal when the output transistor is brought through its dead zone to the threshold of its active region.

10. The integrated circuit of claim 9, further comprising a surrogate output circuit that generates a surrogate output voltage which develops in a manner similar to the output voltage of the output transistor but at a predetermined earlier time before corresponding developments in the output voltage of the output transistor, wherein the output voltage transition onset detector monitors the surrogate output voltage and provides the impulse termination signal when the surrogate output voltage completes an initial onset of surrogate voltage state transition, wherein the impulse termination signal causes the impulse current driver to stop injecting charge into the gate terminal when the output transistor is brought through its dead zone to the threshold of its active region.

11. The integrated circuit of claim 10, wherein the surrogate output circuit is a scaled version of the output buffer circuit which runs at a predetermined faster rate than the output buffer circuit.

12. The integrated circuit of claim 10, wherein the surrogate output circuit is a scaled version of the output buffer circuit which is started a predetermined earlier time than the output buffer circuit.

13. The integrated circuit of claim 12, further comprising a delay circuit for receiving an input signal and for applying a delayed input signal to the output buffer circuit to cause the output buffer to begin a voltage state transition, wherein the input signal is applied to the surrogate output circuit without delay to cause the surrogate output circuit to begin a surrogate voltage state transition, and the delay circuit provides a delay which causes the surrogate output voltage to complete the initial onset of the surrogate voltage state transition the predetermined earlier time before a corresponding initial onset of the voltage state transition of the output buffer circuit.

14. An integrated circuit having an output buffer circuit for driving voltage state transitions of a transmission line, the output buffer circuit comprising:
   (a) an output transistor having a gate terminal for controlling an output voltage of the output transistor which is applied at an output terminal to the transmission line, wherein a voltage state transition comprises changing the output voltage from a first state voltage to a second state voltage, wherein a voltage state transition comprises one of a high-to-low and a low-to-high voltage state transition;

(b) an impulse current driver for providing an impulse current for injecting charge into the gate terminal during an impulse phase at the beginning of the voltage state transition to rapidly bring the output transistor through its dead zone to the threshold of its active region, wherein the impulse current driver comprises a turn-on high-impulse current source for injecting charge into the gate terminal during the impulse phase at the beginning of a high-to-low voltage state transition and a turn-off high-impulse current sink for injecting charge into the gate terminal during the impulse phase at the beginning of a low-to-high voltage state transition; and (c) a slewing current driver for providing a slewing current to the gate terminal after the impulse phase, wherein the slewing current is comparatively limited with respect to the impulse current so as to cause the output transistor to complete a substantially smooth voltage state transition, wherein the slewing current driver comprises a turn-on gentle slewing current source for providing the slewing current to the gate terminal after the impulse phase of a high-to-low voltage state transition and a turn-off gentle slewing current sink for providing the comparatively limited current to the gate terminal after the impulse phase of a low-to-high voltage state transition.

15. An integrated circuit having an output buffer circuit for driving voltage state transitions of a transmission line, the output buffer circuit comprising:

(a) an output transistor having a gate terminal for controlling an output voltage of the output transistor which is applied at an output terminal to the transmission line, wherein a voltage state transition comprises changing the output voltage from a first state voltage to a second state voltage;

(b) an impulse current driver for providing an impulse current for injecting charge into the gate terminal during an impulse phase at the beginning of the voltage state transition to rapidly bring the output transistor through its dead zone to the threshold of its active region;

(c) a slewing current driver for providing a slewing current to the gate terminal after the impulse phase, wherein the slewing current is comparatively limited with respect to the impulse current so as to cause the output transistor to complete a substantially smooth voltage state transition; and (d) an output voltage transition onset detector for providing an impulse termination signal to cause the impulse phase to end so that the impulse current driver stops injecting charge into the gate terminal when the output transistor is brought through its dead zone to the threshold of its active region.

16. The integrated circuit of claim 15, further comprising a surrogate output circuit that generates a surrogate output voltage which develops in a manner similar to the output voltage of the output transistor but at a predetermined earlier time before corresponding developments in the output voltage of the output transistor, wherein the output voltage transition onset detector monitors the surrogate output voltage and provides the impulse termination signal when the surrogate output voltage completes an initial onset of surrogate voltage state transition, wherein the impulse termination signal causes the impulse current driver to stop injecting charge into the gate terminal when the output transistor is brought through its dead zone to the threshold of its active region.

17. The integrated circuit of claim 16, wherein the surrogate output circuit is a scaled version of the output buffer circuit which runs at a predetermined faster rate than the output buffer circuit.

18. The integrated circuit of claim 16, wherein the surrogate output circuit is a scaled version of the output buffer circuit which is started a predetermined earlier time than the output buffer circuit.

19. The integrated circuit of claim 18, further comprising a delay circuit for receiving an input signal and for applying a delayed input signal to the output buffer circuit to cause the output buffer to begin a voltage state transition, wherein the input signal is applied to the surrogate output circuit without delay to cause the surrogate output circuit to begin a surrogate voltage state transition, and the delay circuit provides a delay which causes the surrogate output voltage to complete the initial onset of the surrogate voltage state transition the predetermined earlier time before a corresponding initial onset of the voltage state transition of the output buffer circuit.

* * * * *